US009034154B2

(12) United States Patent
Nakamura et al.

(10) Patent No.: US 9,034,154 B2
(45) Date of Patent: *May 19, 2015

(54) SPUTTERING TARGET AND PROCESS FOR PRODUCING SAME

(75) Inventors: Yuichiro Nakamura, Ibaraki (JP); Akira Hisano, Ibaraki (JP); Junnosuke Sekiguchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 295 days.

This patent is subject to a terminal disclaimer.

(21) Appl. No.: 13/119,867

(22) PCT Filed: Feb. 24, 2010

(86) PCT No.: PCT/JP2010/052837
§ 371 (c)(1),
(2), (4) Date: Mar. 18, 2011

(87) PCT Pub. No.: WO2010/101051
PCT Pub. Date: Sep. 10, 2010

(65) Prior Publication Data
US 2011/0162971 A1    Jul. 7, 2011

(30) Foreign Application Priority Data
Mar. 3, 2009  (JP) .................................. 2009-049188

(51) Int. Cl.
*C23C 14/34* (2006.01)

(52) U.S. Cl.
CPC .................................. *C23C 14/3414* (2013.01)

(58) Field of Classification Search
CPC .................................................. C23C 14/3414
USPC .......................................... 204/298.12, 298.13
See application file for complete search history.

(56) References Cited

U.S. PATENT DOCUMENTS

| 4,895,592 | A |   | 1/1990 | Hatwar et al. |
|---|---|---|---|---|
| 5,460,793 | A |   | 10/1995 | Kano et al. |
| 5,630,918 | A |   | 5/1997 | Takahara et al. |
| 5,632,869 | A | * | 5/1997 | Hurwitt et al. ........... 204/192.12 |
| 6,024,852 | A |   | 2/2000 | Tamura et al. |

(Continued)

FOREIGN PATENT DOCUMENTS

| JP | 61169166 A | * | 7/1986 |
|---|---|---|---|
| JP | 03-257158 A |   | 11/1991 |

(Continued)

OTHER PUBLICATIONS

Translation to Fukui (JP 61-169166) published Jul. 1986.*

(Continued)

*Primary Examiner* — John Brayton
(74) *Attorney, Agent, or Firm* — Howson & Howson LLP

(57) ABSTRACT

A sputtering target with low generation of particles in which oxides, carbides, nitrides, borides, intermetallic compounds, carbonitrides, and other substances without ductility exist in a matrix phase made of a highly ductile substance at a volume ratio of 1 to 50%, wherein a highly ductile and conductive metal coating layer is formed on an outermost surface of the target. Provided are a sputtering target capable of improving the target surface in which numerous substances without ductility exist and preventing or inhibiting the generation of nodules and particles during sputtering, and a method of producing such a sputtering target.

19 Claims, 1 Drawing Sheet

(56) References Cited

U.S. PATENT DOCUMENTS

| | | | |
|---|---|---|---|
| 6,030,514 A * | 2/2000 | Dunlop et al. | 204/298.12 |
| 6,153,315 A | 11/2000 | Yamakoshi et al. | |
| 6,521,062 B1 | 2/2003 | Bartholomeusz et al. | |
| 6,716,542 B2 * | 4/2004 | Uwazumi et al. | 428/836.2 |
| 7,150,810 B2 * | 12/2006 | Hasegawa | 204/192.17 |
| 7,909,949 B2 | 3/2011 | Nakamura et al. | |
| 8,663,402 B2 | 3/2014 | Nakamura et al. | |
| 2005/0239660 A1 * | 10/2005 | Abe et al. | 505/475 |
| 2007/0125645 A1 * | 6/2007 | Nakamura et al. | 204/298.12 |
| 2007/0187236 A1 | 8/2007 | Nakamura et al. | |
| 2007/0209547 A1 | 9/2007 | Irumata et al. | |
| 2007/0215463 A1 | 9/2007 | Parkhe et al. | |
| 2008/0197017 A1 * | 8/2008 | Yi et al. | 204/298.13 |
| 2009/0229975 A1 | 9/2009 | Yamakoshi | |
| 2009/0258165 A1 * | 10/2009 | Tryon et al. | 427/580 |
| 2010/0089622 A1 | 4/2010 | Irumata et al. | |
| 2010/0320084 A1 | 12/2010 | Sato | |
| 2011/0048935 A1 | 3/2011 | Koide | |
| 2012/0273347 A1 | 11/2012 | Koide | |

FOREIGN PATENT DOCUMENTS

| | | | |
|---|---|---|---|
| JP | 04-041668 A | | 2/1992 |
| JP | 06-136524 A | | 5/1994 |
| JP | 09-228037 A | | 9/1997 |
| JP | 10-237637 A | | 9/1998 |
| JP | 11-092923 A | | 4/1999 |
| JP | 11-293454 A | | 10/1999 |
| JP | 2000-199054 A | | 7/2000 |
| JP | 2001-316808 A | | 11/2001 |
| JP | 2001316808 A | * | 11/2001 |
| JP | 2002-069623 A | | 3/2002 |
| JP | 2002-146523 A | | 5/2002 |
| JP | 2002-208125 A | | 7/2002 |
| JP | 2002-302762 A | | 10/2002 |
| JP | 2003-089868 A | | 3/2003 |
| JP | 2003-226954 A | | 8/2003 |
| JP | 2006-045587 A | | 2/2006 |
| JP | 2007-031808 A | | 2/2007 |
| JP | 2009-001860 A | | 1/2009 |
| JP | 2009-132975 A | | 6/2009 |
| WO | 2009/123055 A1 | | 10/2009 |

OTHER PUBLICATIONS

Machine Translation to Yabe (JP 2001-316808) published Nov. 2001.*

JIS B 0631, "Geometrical Product Specification (GPS)—Surface texture: Profile method—Motif Parameters", Mar. 2000.

JIS B 0601, "Geometrical Product Specification (GPS)—Surface texture: Surface texture: Profile method—Terms, definitions and surface texture parameters", Mar. 2013.

* cited by examiner

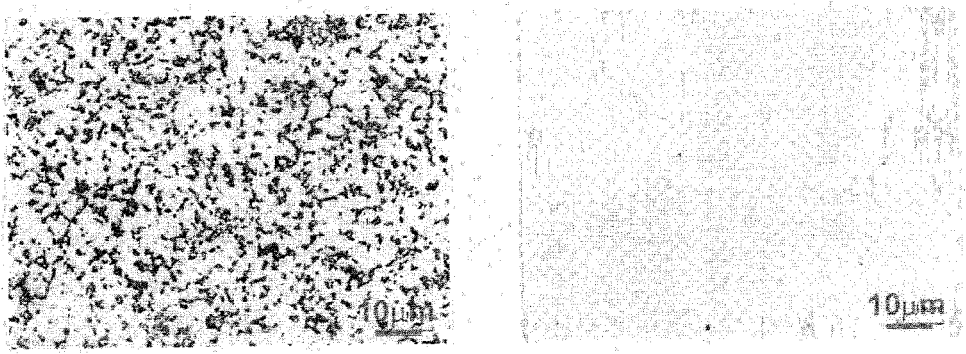

SPUTTERING TARGET AND PROCESS FOR PRODUCING SAME

BACKGROUND OF THE INVENTION

The present invention relates to a sputtering target with low generation of sparticles and to process for producing same.

The sputtering method is a well-known technique as a means for forming a thin film. The basic principle thereof is to apply voltage between a substrate (anode side) to which the thin film is to be formed and a target (cathode side) facing the substrate at a close distance and which is formed from a thin film forming substance, so as to change argon gas into a plasma. As a result, the argon ions generated thereby collide with the target, which is a cathode material, the energy thereof discharges (knocks out) the target material outside, and the discharged material is laminated on the opposed substrate face.

A thin film forming device employing this sputtering principle includes various modified types such as a bipolar bias sputtering device, high frequency sputtering device, plasma sputtering device, but these devices employ the same basic principle.

The material for forming the thin film is referred to as a target, since it becomes the target of the argon ions. Since this target is formed from the collision energy of ions, the thin film forming material constituting the target is laminated on the substrate in an atomic form, or a cluster form formed from an aggregate of such atoms. As a result, a fine and accurate thin film can be formed, and this is the reason it is being widely used in various electronic components today.

Recently, this sputtering used for forming thin films is being demanded of extremely sophisticated deposition methods, and an important task is to form films with few defects.

The generation of such defects in this sputtering is not only attributable to the sputtering method, but is also often caused by the target itself. As such a cause of the generation of defects resulting from the target, there is the generation of particles and nodules.

In normal conditions, the material sputtered (discharged) from the target will adhere to the opposed substrate, but the material is not necessarily sputtered perpendicularly, and is discharged in various directions. This kind of discharged material will adhere to the components inside the sputtering device other than the substrate, and this at some point will peel off, float, and reattach to the substrate.

This kind of material is referred to as particles, and this is not an originally scheduled thin film forming material. Further, since such particles often adhere as a large cluster, for instance, these particles will cause a short circuit in the fine wiring film of electronic components, and lead to the generation of defective products. In the generation of such particles, it has been discovered that the generation of particles will increase or decrease depending on the degree of materials discharged from the target; that is, the surface condition of the target.

Further, generally, the target face material is not reduced (eroded) evenly due to the sputtering, but there is a tendency that a specific area, a ring shape for example, is eroded depending on the inherent characteristics of the constituent material and sputtering device, and on method of applying voltage. Moreover, depending on the type of target material or the production method of the target, a protrusive substance with numerous bumps known as nodules is formed on the target surface.

Since this is one of the thin film forming materials, it will not directly affect the thin film. Nevertheless, minute arcs (microarcing) will occur to the protrusions of the nodules, and it has been observed that this results in the increase of particles.

Recently, a target is not formed from a uniform material, and is often used in a state where oxides, carbides, nitrides, borides, intermetallic compounds, carbonitrides, and other substances are mixed in a matrix phase made of a ductile material. Here, a problem of increase in the generation of nodules and particles arises.

As conventional technology, disclosed is a sputtering target in which the processing defect layer (fracture layer) containing minute cracks and defective parts arising during the machine work is removed from the surface of a high-melting point metal alloy sputtering target (c.f. Patent Document 1); and a technique for uniformizing the film and suppressing the generation of nodules and particles by adjusting the surface roughness of the sputtering target so as to reduce the amount of residual contamination, hydrogen content on the surface, and thickness of the affected layer (c.f. Patent Document 2).

Nevertheless, although these technologies anticipate that the generation of nodules and particles will considerably affect the surface condition of the target, the actual situation is that they are unable to resolve the existing problems.

Moreover, technology is disclosed for inhibiting the generation of initial arcing in an ITO sputtering target by covering the surface, which was subject to grinding and polishing, with ITO as the same material as the target (Patent Document 3). Nevertheless, this technology is characterized in coating the same material, and can only be achieved with ITO. In addition, this technology fails to solve the problems in severe conditions where oxides, carbides, nitrides, borides, intermetallic compounds, carbonitrides, and other substances without ductility exist in the target.

[Patent Document 1] Japanese Published Unexamined Application No. H3-257158
[Patent Document 2] Japanese Published Unexamined Application No. H11-1766
[Patent Document 3] Japanese Published Unexamined Application No. 2003-89868

SUMMARY OF THE INVENTION

Accordingly, an object of the present invention is to provide a sputtering target with superior characteristics such as being able to improve the target surface in which numerous oxides, carbides, nitrides, borides, intermetallic compounds, carbonitrides, and other substances without ductility exist in a matrix phase made of a highly ductile substance, and prevent or suppress the generation of nodules and particles upon sputtering, and to provide the production method thereof.

The present invention provides:

1) A sputtering target with low generation of particles in which oxides, carbides, nitrides, borides, intermetallic compounds, carbonitrides, and other substances without ductility exist in a matrix phase made of a highly ductile substance at a volume ratio of 1 to 50%, wherein a highly ductile and conductive metal coating layer is formed on an outermost surface of the target;

2) The sputtering target according to 1) above, wherein, with the target surface before forming the metal coating layer, a center-line average surface roughness Ra is 0.1 μm or less, a ten-point average roughness Rz is 0.4 μm or less, a distance between local peaks (roughness motif) AR is 120 μm or less, and an average undulation motif length AW is 1500 μm or more;

3) The sputtering target according to 1) or 2) above, wherein the oxides, carbides, nitrides, borides, intermetallic compounds, carbonitrides, and other substances without ductility existing in a matrix phase made of a highly ductile substance have an average grain size of 0.1 to 10 µm.

4) The sputtering target according to any one of 1) to 3) above, wherein the metal coating layer is made of at least one type among metals configuring the matrix phase made of a highly ductile substance.

5) The sputtering target according to any one of 1) to 4) above, wherein thickness of the metal coating layer is 100 nm to 300 nm; and 6) The sputtering target according to any one of 1) to 4) above, wherein the metal coating layer is composed of at least one type among Co, Cr, and Pt.

The present invention additionally provides:

7) A method of producing a sputtering target with low generation of particles in which oxides, carbides, nitrides, borides, intermetallic compounds, carbonitrides, and other substances without ductility exist in a matrix phase made of a highly ductile substance at a volume ratio of 1 to 50%, wherein a highly ductile and conductive metal coating layer is formed on an outermost surface of the target via chemical plating method or physical vapor deposition;

8) A method of producing a sputtering target with low generation of particles, wherein a surface of a target in which oxides, carbides, nitrides, borides, intermetallic compounds, carbonitrides, and other substances without ductility exist in a matrix phase made of a highly ductile substance at a volume ratio of 1 to 50% is subject to primary processing of cutting work in advance and subsequently subject to finish processing of polishing so as to form a smooth surface in which a center-line average surface roughness Ra is 0.1 µm or less, a ten-point average roughness Rz is 0.4 µm or less, a distance between local peaks (roughness motif) AR is 120 µm or less, and an average undulation motif length AW is 1500 µm or more, and additionally forming a highly ductile and conductive metal coating layer via chemical plating method or physical vapor deposition;

9) The method of producing a sputtering target according to 8) above, wherein the primary processing of cutting work is performed to cut an area of 1 mm to 10 mm from the surface of the target material; and 10) The method of producing a sputtering target according to 8) or 9) above, wherein polishing is performed to polish an area of 1 µm to 50 µm from the surface after being subject to the primary processing of cutting work.

The present invention forms a highly ductile and conductive metal coating layer on the outermost layer of a target in which oxides, carbides, nitrides, borides, intermetallic compounds, carbonitrides, and other substances without ductility exist in a matrix phase made of a highly ductile substance at a volume ratio of 1 to 50%, and is thereby able to obtain a target with superior surface characteristics. This metal coating layer yields the effect of being able to supplement the bonding power to the matrix of oxides, carbides, nitrides, borides, intermetallic compounds, carbonitrides, and other substances without ductility, and inhibit a charge from being applied locally due to insulating substances such as oxides, carbides, nitrides, borides, and carbonitrides without conductivity. As a result of performing sputtering with this target, a superior effect is yielded in that it is possible to prevent or inhibit the generation of particles and nodules during sputtering.

BRIEF DESCRIPTION OF THE DRAWINGS

FIG. 1 A photograph (laser microscope image) of the Co coated surface and the surface before coating.

DETAILED DESCRIPTION OF THE INVENTION

The target subject to the surface processing of the present invention is a target in which oxides, carbides, nitrides, borides, intermetallic compounds, carbonitrides, and other substances without ductility are mixed in a highly ductile matrix phase at a volume ratio of 1 to 50%. A typical example of this kind of target is a Co—Cr—Pt alloy as an example of a matrix phase, and (Co—Cr—Pt)—$SiO_2$ as a hard disk target made of $SiO_2$ as a substance without ductility. Nevertheless, it goes without saying that the present invention is not limited to the foregoing materials, and may be applied to other similar materials.

When this kind of target material with substances without ductility being mixed therein is subject to cutting work with a cutting tool, for example, with the location where oxides, carbides, nitrides, borides, intermetallic compounds, carbonitrides, and other substances without ductility exist as the point of origin, defects (dents) in the form of cracks, indentations caused by fallouts, or in some cases fragments remaining in the indentation will be formed.

This kind of surface defect often occurs even when the material without ductility having an average particle diameter of 0.1 to 10 µm or more is evenly and finely dispersed. Further, when the hardness thereof is measured, it often seems to be that the Vickers hardness of the highly ductile matrix phase is 400 or less, the Vickers hardness of the oxides, carbides, nitrides, borides, intermetallic compounds, carbonitrides, and other substances without ductility is 400 or more, and the hardness difference is 1 times.

Therefore, in such a case, the surface processing method of the present invention is particularly effective.

The sputtering target of the present invention is characterized in that a highly ductile and conductive metal coating layer is formed on the outermost surface of the target in which oxides, carbides, nitrides, borides, intermetallic compounds, carbonitrides, and other substances without ductility are mixed in a matrix phase made of a highly ductile substance at a volume ratio of 1 to 50%.

There is no limitation in the type of metal that can be used in this metal coating layer, and just about any type of metal can be used so as long as it is a highly ductile and conductive metal. As described later, since it will be sufficient to form an extremely thin film, it is extremely rare that the metal itself will become a contaminant in the sputtered film layer.

A material that is favorable as the coating layer of the outermost surface of the target can be selected from at least one type among metals configuring the matrix phase made of a highly ductile substance. It is thereby possible to completely inhibit contamination.

As the highly ductile material in which oxides, carbides, nitrides, borides, intermetallic compounds, carbonitrides, and other substances without ductility are mixed in a matrix phase made of a highly ductile substance, uses is metal; specifically, Co, Cr, Pt, Ru and an alloy containing one or more of such metals, and a typical example would be Co—Cr—Pt alloy or the like that is used as a hard disk material. Moreover, the thickness of the coating layer is sufficient at 100 nm to 300 nm.

As a mode of the sputtering target of the present invention, preferably, with the target surface before forming the metal coating layer, a center-line average surface roughness Ra is 0.1 µm or less, a ten-point average roughness Rz is 0.4 µm or less, a distance between local peaks (roughness motif) AR is 120 µm or less, and an average undulation motif length AW is 1500 µm or more.

In addition, preferably, the oxides, carbides, nitrides, borides, intermetallic compounds, carbonitrides, and other substances without ductility existing in a matrix phase made of a highly ductile substance have an average grain size of 0.1 to 10 μm.

The foregoing modes are associated with the direct adjustment of the oxides, carbides, nitrides, borides, intermetallic compounds, carbonitrides, and other substances without ductility in the matrix, and the effect of the metal coating layer can be further improved by adjusting the condition of the surface as described above. This yields the effect of increasing the bonding power to the matrix.

Accordingly, the conductive metal layer yields an effect of inhibiting a charge from being applied locally due to insulating substances such as oxides, carbides, nitrides, borides, and carbonitrides without conductivity. It is thereby possible to effectively prevent or inhibit the generation of particles and nodules in the entire sputtering process and not only at the initial stage of sputtering.

When producing the sputtering target, produced is a sputtering target in which oxides, carbides, nitrides, borides, intermetallic compounds, carbonitrides, and other substances without ductility exist in a matrix phase made of a highly ductile substance at a volume ratio of 1 to 50%, and a highly ductile and conductive metal coating layer is formed on an outermost surface of the target.

As the chemical plating method, electroplating methods such representative coating methods as the electrochemical plating method or the electroless plating method may be used, and these may be used. Moreover, as the physical vapor deposition, the vacuum deposition method, sputtering method, ion beam deposition method and the like may be used.

More specifically, a surface of a target in which oxides, carbides, nitrides, borides, intermetallic compounds, carbonitrides, and other substances without ductility exist in a matrix phase made of a highly ductile substance at a volume ratio of 1 to 50% is subject to primary processing of cutting work in advance.

This is subsequently subject to finish processing of polishing so as to form a smooth surface in which a center-line average surface roughness Ra is 0.1 μm or less, a ten-point average roughness Rz is 0.4 μm or less, a distance between local peaks (roughness motif) AR is 120 μm or less, and an average undulation motif length AW is 1500 μm or more. A highly ductile and conductive metal coating layer can be formed via the chemical plating method or physical vapor deposition described above.

Further, desirably, an area of 1 mm to 10 mm is cut from the surface of the target material by the primary processing of the cutting work. And, in performing the finishing processing via polishing, desirably, an area of 1 μm to 50 μm is polished from the surface which was subject to the primary processing of cutting work. The purpose of cutting an area of 1 mm to 10 mm is to effectively remove the defects on the target material surface that were previously formed thereon. It is desirable to perform cutting via lathe processing employing a cutting tool or a chip.

As a result of this cutting work (primary processing), although the generation of defects such as cracks and indentations caused by fallouts as described above will occur, such defects can be polished with sandpaper or a grindstone having a rough grain size of, for instance, #80 to #400. Thereby, the foregoing defects such as cracks and indentations caused by fallouts are eliminated, and a flat and smooth target face is formed thereby.

Sandpaper or a grindstone having a rough grain size of #80 to #400 is able to effectively eliminate the defects originating from oxides, carbides, nitrides, borides, intermetallic compounds, carbonitrides, and other substances without ductility generated from the cutting work, and is the optimum range of preparing a flat and smooth surface including a ductile matrix phase. Here, there is no need to perform mirror polishing, and it will suffice so as long as the fallout of cracks and indentations can be removed. When preparing a flat and smooth target without surface defects such as cracks and indentations caused by fallouts, it is possible to consider polishing the target material from the start with sandpaper or a grindstone having a rough grain size of #80 to #400. Nevertheless, in such a case, there is a problem in that the amount of time required for polishing processing will be enormous, and the maintenance frequency of the grindstone will increase due to the substance of a highly ductile matrix phase adhering to the grindstone.

In addition, particularly with manual polishing processing, although there may not be a significant difference in the surface roughness, there is a tendency that the outer periphery and center portion are polished more, and another problem is that an undulation will occur on the target surface. Therefore, in reality, it is impossible that the surface processing of the target is achieved only by polishing processing, without performing cutting work.

Subsequently, the present invention performs primary processing of cutting using a lathe to finalize a target shape, and, as needed, after performing grinding processing, performs the processes of wet secondary polishing including wet primary polishing based on pure water drop→alumina polishing agent drop. It is thereby possible to achieve a center-line average surface roughness Ra of 0.1 μm or less, a ten-point average roughness Rz of 0.4 μm or less, a distance between local peaks (roughness motif) AR of 120 μm or less, and an average undulation motif length AW of 1500 μm or more, and obtain a target surface that is flat and extremely smooth.

Since the center-line average surface roughness Ra, the ten-point average roughness Rz, the distance between local peaks (roughness motif) AR and the average undulation motif length AW are definitions of the surface roughness standardized with JIS (refer to JIS B0601, JIS B0631), the explanation is omitted.

Nevertheless, it should be understood that the cutting and polishing of the surface and the condition of the target surface are preferred conditions, and not essential conditions.

What is important in the present invention is to form a highly ductile and conductive metal coating layer on the outermost surface of the target. It is thereby possible to yield a considerable effect of preventing or inhibiting the generation of nodules and particles upon sputtering a target in which oxides, carbides, nitrides, borides, intermetallic compounds, carbonitrides, and other substances without ductility exist in a matrix phase made of a highly ductile substance.

EXAMPLES

Next, the Examples of the present invention are explained. These Examples are merely illustrative, and the present invention shall not in any way be limited by such Examples.

Example 1

Co powder, Cr powder, Pt powder, and $SiO_2$ powder were used as the raw material, and a target raw material was obtained based on the production conditions of hot pressing and HIP. The volume ratio of $SiO_2$ without ductility in this target was 25%, and the average grain size of the $SiO_2$ grains was 2 μm. The major component of the matrix phase was a uniform Co—Cr—Pt alloy.

After performing primary processing of cutting using a lathe to finalize a target shape, grinding processing was additionally performed, and the processes of wet secondary polishing including wet primary polishing based on pure water drop→alumina polishing agent drop were performed to adjust the surface and obtain a target.

The average surface roughness of the target in which the surface roughness was adjusted as described above; specifically, the measurement results of the center-line average surface roughness Ra, the ten-point average roughness Rz, the distance between local peaks (roughness motif) AR, and the average undulation motif length AW are shown in Table 1. The measurement points were the three points of the target surface, and the numerical values shown in Table 1 are the average value of the three points.

As shown in Table 1, Ra was 0.045 μm, Rz was 0.28 μm, AR was 111.11 μm, and AW was 1700.00 μm. In all cases the center-line average surface roughness Ra was in the range of 0.1 μm or less, the ten-point average roughness Rz was in the range of 0.4 μm or less, the distance between local peaks (roughness motif) AR was in the range of 120 μm or less, and the average undulation motif length AW was in the range of 1500 μm or more, and it was possible to obtain an extremely smooth target surface with minimal surface roughness.

Subsequently, 200 nm of cobalt was deposited on the surface of this target with the ion plating method. The photograph of the Co coated surface and the surface before coating is shown in FIG. 1. The left side of FIG. 1 shows the surface before coating, and the right side shows the Co coated surface, and the existence of oxides could hardly be observed after the Co coating.

Thus, the cobalt coated target was used to form a sputtered film on a substrate in an Ar 1.5 Pa atmosphere under the DC sputtering condition of 30 w/cm².

When observing the particles that were generated during the sputtering, the size of the particles was approximately 1 μm×1 μm ("long diameter×short diameter"; hereinafter the same), and there was hardly any difference in comparison to the grain size of oxides of approximately 1 μm×1 μm.

The results are shown in Table 1. In addition, the number of defectives (defectives/mm²) caused by the particles was reduced to 1.8.

Example 2

Other than achieving Ra of 0.256 μm, Rz of 1.234 μm, AR of 118.76 μm, and AW of 1530.50 μm in the processes of wet secondary polishing, a cobalt coated target was produced based on the same production conditions as Example 1, and a sputtered film was formed on a substrate in an Ar 1.5 Pa atmosphere under the DC sputtering condition of 30 w/cm².

When observing the particles that were generated during the sputtering, the size of the particles was approximately 1 μm×1 μm ("long diameter×short diameter"; hereinafter the same), and there was hardly any difference in comparison to the grain size of oxides of approximately 1 μm×1 μm.

The results are similarly shown in Table 1. In addition, the number of defectives (defectives/mm²) caused by the particles was reduced to 2.2.

Even if the renter-line average surface roughness Ra is outside the range of 0.1 μm or less, the ten-point average roughness Rz is outside the range of 0.4 μm or less, distance between local peaks (roughness motif) AR is outside the range of 120 μm or less, and the average undulation motif length AW is outside the range of 1500 μm or more, if it is possible to deposit 200 nm of cobalt on the surface of this target with the ion plating method with no space in between, the generation of particles at the initial stage of sputtering was slightly inferior to Example 1, but roughly the same effect was yielded. For example, if the center-line average surface roughness Ra is within the range of 0.5 μm or less, the ten-point average roughness Rz is within the range of 2 μm or less, the distance between local peaks (roughness motif) AR is within the range of 120 μm or less, and the average undulation motif length AW is within the range of 1500 μm or more, it has been confirmed that coating with no space in between is possible and the same effect can be yielded.

TABLE 1

| | Ra (μm) | Rz (μm) | AR (μm) | AW (μm) | Particle size (μm) | Number of defectives (defectives/mm²) |
|---|---|---|---|---|---|---|
| Example 1 | 0.045 | 0.28 | 111.11 | 1700.00 | 1 × 1 | 1.8 |
| Example 2 | 0.256 | 1.234 | 118.76 | 1530.50 | 1 × 1 | 2.2 |
| Comparative Example 1 | 1.633 | 7.387 | 180.40 | 1115.47 | 1 × 2 | 20 |
| Comparative Example 2 | 0.333 | 2.047 | 171.10 | 1215.00 | 1 × 2 | 15 |

Comparative Example 1

In Comparative Example 1, Co powder, Cr powder, Pt powder, and $SiO_2$ powder were used as the raw material, and a target raw material was obtained based on the production conditions of hot pressing and HIP as with Example 1, and this target was only subject to lathe finishing.

The average surface roughness of this target; specifically, the measurement results of the center-line average surface roughness Ra, the ten-point average roughness Rz, the distance between local peaks (roughness motif) AR, and the average undulation motif length AW are shown in Table 1. The measurement points were the three points of the target surface, and the numerical values shown in Table 1 are the average value of the three points.

As shown in Table 1, Ra was 1.633 μm, Rz was 7.397 μm, AR was 180.40 μm, and AW was 1115.47 μm. In all cases the center-line average surface roughness Ra was considerably outside the range of 0.1 μm or less, the ten-point average roughness Rz was considerably outside the range of 0.4 μm or less, the distance between local peaks (roughness motif) AR was considerably outside the range of 120 μm or less, and the average undulation motif length AW was considerably outside the range of 1500 μm or more of the present invention, and the obtained target surface was considerably rough and severely uneven. In addition, it was not possible to form a metal coating layer such as a Co layer on the target surface.

Subsequently, this target was used to form a sputtered film on a substrate in an Ar 1.5 Pa atmosphere under the DC sputtering condition of 30 w/cm².

When observing the particles that were generated during the sputtering, particles with a size of approximately 1 μm×2 μm had generated. The results are similarly shown in Table 1. Moreover, the number of defectives (defectives/mm²) caused by the particles increased to approximately 20.

Comparative Example 2

After performing the primary processing of cutting using a lathe in Comparative Example 1, surface grinding (surface grinding processing) was performed to prepare a target. Other conditions were the same as Comparative Example 1.

The average surface roughness of this target; specifically, the measurement results of the center-line average surface roughness Ra, the ten-point average roughness Rz, the distance between local peaks (roughness motif) AR, and the average undulation motif length AW are shown in Table 1. The measurement points were the three points of the target surface, and the numerical values shown in Table 1 are the average value of the three points.

As shown in Table 1, Ra was 0.333 μm, Rz was 2.047 μm, AR was 171.10 μm, and AW was 1215.00 μm. Although some improvement can be seen in comparison to the case of only performing lathe processing, in all cases the center-line average surface roughness Ra was considerably outside the range of 0.1 μm or less, the ten-point average roughness Rz was considerably outside the range of 0.4 μm or less, the distance between local peaks (roughness motif) AR was considerably outside the range of 120 μm or less, and the average undulation motif length AW was considerably outside the range of 1500 μm or more of the present invention, and the obtained target surface was considerably rough and severely uneven. In addition, it was not possible to form a metal coating layer such as a Co layer on the target surface.

Subsequently, this target was used to form a sputtered film on a substrate in an Ar 1.5 Pa atmosphere under the DC sputtering condition of 30 w/cm$^2$.

When observing the particles that were generated during the sputtering, particles with a size of approximately 1 μm×2 μm had generated. The results are similarly shown in Table 1. Moreover, the number of defectives (defectives/mm$^2$) caused by the particles increased to approximately 15.

As evident from the comparison of Example 1 and Comparative Examples 1 and 2, in Example 1 the surface roughness was considerably small and a smooth surface was formed. By additionally forming a ductile and conductive metal coating layer, it was possible to reduce the number of nodules and the size of particles that were generated after sputtering the target, which are especially problematic in forming a thin film, and reduce the level of defectiveness caused by the generation of particles.

Accordingly, it is evident that the cutting work, polishing process and surface processing method of forming a ductile and conductive metal coating layer of the present invention yield superior effects in the surface processing of a target in which oxides, carbides, nitrides, borides, intermetallic compounds, carbonitrides, and other substances without ductility exist in a matrix phase made of a highly ductile substance at a volume ratio of 1 to 50%.

Although (Co—Cr—Pt)—SiO$_2$ was indicated as the representative example in the foregoing explanation, as a modified example thereof, for example, Pt may be excluded from Co, Cr, and Pt, or Ru may be added thereto. In addition, as a representative example of a substance without ductility, TiO$_2$, Cr$_2$O$_3$, Ta$_2$O$_5$, CoO and the like may be considered in addition to SiO$_2$. However, it should be easy to understand that one type or two or more types among the above may be contained in the foregoing example. The present invention covers all of these examples.

The present invention forms a highly ductile and conductive metal coating layer on the outermost layer of a target, and is thereby able to obtain a target with superior surface characteristics. This metal coating layer yields the effect of being able to supplement the bonding power to the matrix of oxides, carbides, nitrides, borides, intermetallic compounds, carbonitrides, and other substances without ductility, and this metal layer with conductivity is able to further inhibit a charge from being applied locally due to insulating substances such as oxides, carbides, nitrides, borides, and carbonitrides without conductivity. Thus, it is thereby possible to obtain a target with superior surface characteristics.

As a result of performing sputtering with this target, a superior effect is yielded in that it is possible to prevent or inhibit the generation of particles and nodules during sputtering.

Accordingly, the present invention is particularly effective for a target; especially a target for producing a hard disk in which oxides, carbides, nitrides, borides, intermetallic compounds, carbonitrides, and other substances without ductility exist in a matrix phase made of a highly ductile substance at a volume ratio of 1 to 50%.

The invention claimed is:

1. A sputtering target capable of suppressing generation of particles during sputtering, comprising:
   a body made of a first substance forming a matrix phase of said body within which a second granular substance is dispersed at a volume ratio of 1 to 50% of said body, said matrix phase having a Vickers hardness of 400 Hv or less and being ductile relative to said second granular substance which has a Vickers hardness greater than that of said matrix phase and which is brittle relative to said matrix phase; and
   a conductive metal coating layer formed on an outermost finished surface of said body, said conductive metal coating layer forming an exposed front face of the sputtering target for being subject to sputtering during a sputtering operation;
   wherein said outermost finished surface of said body on which said conductive metal coating layer is formed has a center-line average surface roughness, Ra, of 0.1 μm or less, a roughness, of Rz, of 0.4 μm or less an average length of roughness motif, AR, of 120 μm or less, and an average length of waviness motif, AW, of 1500 μm or more.

2. The sputtering target according to claim 1, wherein said second granular substance is selected from the group consisting of oxides, carbides, nitrides, borides, intermetallic compounds, and carbonitrides having an average grain size of 0.1 to 10 λm.

3. The sputtering target according to claim 2, wherein said conductive metal coating layer is composed of at least one metal element configuring said matrix phase.

4. The sputtering target according to claim 3, wherein said conductive metal coating layer has a thickness of 100 to 300 nm.

5. The sputtering target according to claim 3, wherein said conductive metal coating layer is composed of at least one element selected from the group consisting of Co and Cr.

6. A method of producing a sputtering target capable of suppressing generation of particles during sputtering, comprising the steps of:
   providing a body made of a first substance forming a matrix phase of the body within which a second granular substance is dispersed at a volume ratio of 1 to 50% of the body, the matrix phase having a Vickers hardness of 400 Hv or less and being ductile relative to the second granular substance which has a Vickers hardness greater than that of the matrix phase and which is brittle relative to the matrix phase;
   cutting the body to produce a target shape with a face;
   after said cutting step, polishing said face with a grindstone or abrasive paper having a rough grain size of #80 to #400;

after said polishing step, subjecting said face to primary wet polishing using droppings of pure water and secondary wet polishing using droppings of alumina abrasive agent to provide said face with a center-line average surface roughness, Ra, of 0.1 μm or less, a ten-point average roughness Rz, of 0.4 μm or less, an average length of roughness motif, AR, of 120 μm or less, and an average length of waviness motif, AW, of 1500 μm or more; and after said subjecting step forming a ductile and conductive metal coating layer on said face via chemical plating method or physical vapor deposition, the conductive metal coating layer forming an exposed front face of the sputtering target for being subject to sputtering during a sputtering operation.

7. A method of producing a sputtering target capable of suppressing generation of particles during sputtering, comprising the steps of:

providing a body made of a first substance forming a matrix phase of the body within which a second granular substance is dispersed at a volume ratio of 1 to 50% of the body, the matrix phase having a Vickers hardness of 400 Hv or less and being ductile relative to the second granular substance which has a Vickers hardness greater than that of the matrix phase and which is brittle relative to the matrix phase;

processing a surface of the body to cutting work and then mechanical polishing to form a finished surface having a center-line average surface roughness, Ra, of 0.1 μm or less, a ten-point average roughness, Rz, of 0.4 μm or less, an average length of roughness motif, AR, of 120 μm or less, and an average length of waviness motif, AW, of 1500 μm or more; and forming a ductile and conductive metal coating layer on the finished surface of the body via chemical plating or physical vapor deposition such that the conductive metal coating layer forms an exposed front face of the sputtering target for being subject to sputtering during a sputtering operation.

8. The method of producing a sputtering target according to claim 7, wherein the cutting work is performed such that a surface layer of a thickness of 1 to 10 mm is severed from the body.

9. The method of producing a sputtering target according to claim 8, wherein the mechanical polishing is performed such that a surface layer of the body, which is formed as a result of the cutting work and which is of a thickness of 1 to 50 μm, is removed from the body.

10. The method of producing a sputtering target according to claim 7, wherein the mechanical polishing is performed such that a surface layer of the body, which is formed as a result of the cutting work and which is of a thickness of 1 to 50 μm, is removed from the body.

11. The sputtering target according to claim 1, wherein said second granular substance is selected from the group consisting of oxides, carbides, nitrides, borides, intermetallic compounds, and carbonitrides having an average grain size of 0.1 to 10 μm.

12. The sputtering target according to claim 1, wherein said matrix phase is made of a Co—Cr alloy, and wherein said conductive metal coating layer is made of at least one of Co and Cr.

13. The sputtering target according to claim 12, wherein said conductive metal coating layer has a thickness of 100 to 300 nm.

14. The sputtering target according to claim 1, wherein said conductive metal coating layer is made of at least one of Cr and Ru.

15. The sputtering target according to claim 4, wherein said second granular substance has a Vickers hardness of 400 Hv or more and that is 1.5 times the Vickers hardness of said matrix phase.

16. The sputtering target according to claim 5, wherein said second granular substance is an oxide selected from the group consisting of $SiO_2$, $TiO_2$, $Cr_2O_3$, $Ta_2O_5$ and CoO, and wherein said matrix phase is made of a Co—Cr alloy.

17. The sputtering target according to claim 16, wherein said Co—Cr alloy includes Pt or Ru.

18. The sputtering target according to claim 4, wherein said conductive metal coating layer is made of Cr.

19. The sputtering target according to claim 3, wherein said conductive metal coating layer is made of Ru.

* * * * *